United States Patent [19]
Hosaka

[11] Patent Number: 6,081,213
[45] Date of Patent: Jun. 27, 2000

[54] METHOD AND APPARATUS FOR ARITHMETIC CODING, METHOD AND APPARATUS FOR ARITHMETIC DECODING, AND STORAGE MEDIUM

[75] Inventor: Kazuhisa Hosaka, Tokyo, Japan

[73] Assignee: Sony Corporation, Tokyo, Japan

[21] Appl. No.: 09/047,946

[22] Filed: Mar. 25, 1998

[30] Foreign Application Priority Data

Mar. 26, 1997 [JP] Japan .................................. 9-073315

[51] Int. Cl.[7] .................................................. H03M 7/00
[52] U.S. Cl. ............................................. 341/107; 341/106
[58] Field of Search .............................. 341/107, 65, 67, 341/106

[56] References Cited

U.S. PATENT DOCUMENTS

| | | | |
|---|---|---|---|
| 4,989,000 | 1/1991 | Chevion et al. ........................ | 341/107 |
| 5,418,532 | 5/1995 | Lei ........................................... | 341/107 |
| 5,587,710 | 12/1996 | Choo et al. ............................ | 341/107 |

*Primary Examiner*—Brian Young
*Assistant Examiner*—Peguy Jean Pierre
*Attorney, Agent, or Firm*—Frommer, Lawrence & Haug, LLP.; William S. Frommer

[57] ABSTRACT

The efficiency of arithmetic coding is improved. When both the maximum value and the minimum value of a base interval are included in a segment interval, no code is output because there is no need for identifying the base interval from other intervals. When only the minimum value of the base interval is included, the code of 0 is output because the code of 1 is necessarily output for the other interval. When only the maximum value of the base interval is included, the code of 1 is output because the code of 0 is output for the other interval. When neither the maximum value nor the minimum value is included, the code of 01 or 10 is output.

14 Claims, 11 Drawing Sheets

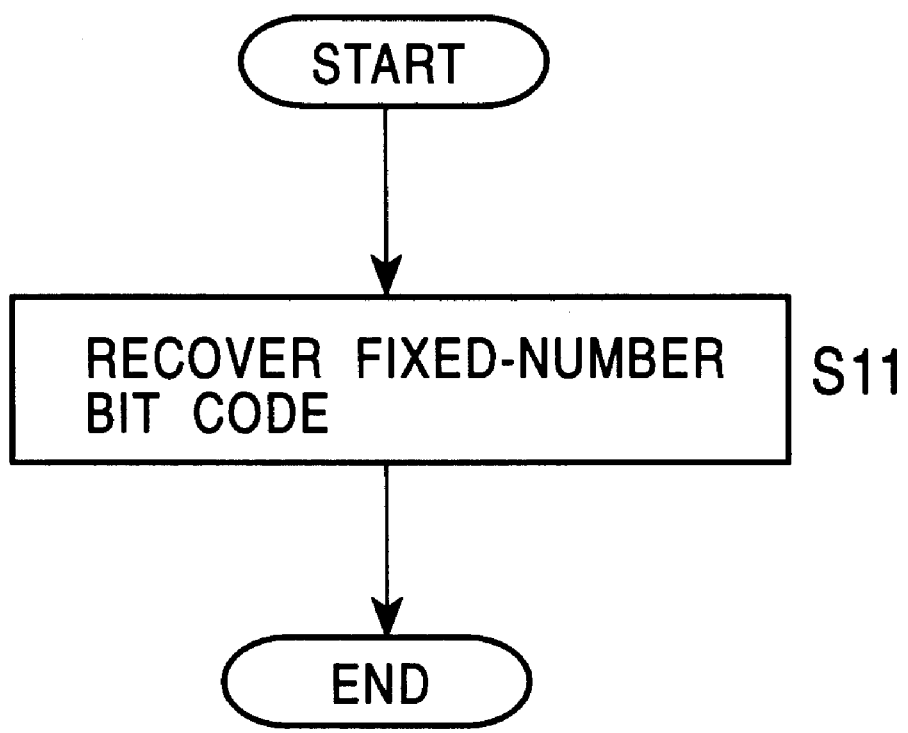

METHOD AND APPARATUS FOR ARITHMETIC CODING, METHOD AND APPARATUS FOR ARITHMETIC DECODING, AND STORAGE MEDIUM

BACKGROUND OF THE INVENTION

1. Field of the Invention

The present invention relates to a method and apparatus for arithmetic coding, a method and apparatus for arithmetic decoding, and a storage medium intended for reducing the quantity of data transferred over a transmission line and the quantity of data stored in the storage medium.

2. Description of the Related Art

Given a string of input symbols and their probability of occurrence, an arithmetic coding, one of available coding methods, codes an input symbol. An arithmetic code is the code of a coordinate at a point included in a segment interval that is finally obtained by executing recursively to an input symbol the process in which a base interval as a real number interval is segmented into segment intervals, each proportional to the probability of occurrence of each input symbol, with the input symbol associated with the corresponding segment interval.

The principle of arithmetic coding is now discussed referring to FIG. 6.

The base interval typically used in arithmetic coding is an interval [0, 1). The symbol "[" here means that the value following it is included in the range of the interval and the symbol ")" means that the value preceding it is not included in the range of the interval. The interval [0, 1) represents the interval in which a real number satisfying the condition of $0 \leq x < 1$ is present. The base interval is shown in the left portion of FIG. 6. The base interval is segmented into segment intervals proportionally to the probability of occurrence of an input symbol, and any of the segment intervals is selected in response to the input signal.

Let Pa and Pb represent probabilities of input symbols a and b when input symbols are two, a and b, for example (Pa+Pb=1). The base interval [0, 1) is segmented into a segment interval [0, Pa) for the input symbol a and a segment interval [Pa, 1) for the input symbol b. One of the two intervals is selected depending on the input symbol. Now the interval [0, Pa) is selected assuming that the input symbol is a.

Thereafter, the selected segment interval is segmented proportionally to the probability of occurrence of the input symbol, and one of the segment intervals is selected. This process is repeated. For example, FIG. 6 shows the case that the input symbol a is followed by input symbols b and a. The segment interval in which the subsequent symbol b is processed is shown in the central portion of FIG. 6 and the segment interval in which the final symbol a is processed is shown in the right portion of FIG. 6. More particularly, the subsequent input symbol b selects the interval [Pa×Pa, Pa) and the final input symbol a selects the interval [Pa×Pa, Pa×Pa+(Pa−Pa×Pa)×Pa).

When the probabilities of occurrence Pa=⅓ and Pb=⅔, the finally selected segment interval is [⅑, 5/27). In arithmetic coding, the coordinate of a point included in this segment interval, expressed in binary fraction, is transmitted. Since the binary expression of the segment interval is [0.000111 . . . , 0.001011 . . .) in this case, the output code is 00100. Among real numbers equal to or greater than 0.000111 but equal to or smaller than 0.001011, one fraction having the minimum number of fractional digits is output as a code. In the above example, $0.000111 \leq 0.00100 \leq 0.001011$.

The principle of arithmetic coding has been discussed. As a string of input symbols gets longer, a large number of significant figures are required and handling them is impossible in practice. The following technique has been conventionally used.

As shown in FIG. 7, when a selected interval [x, y) is included in an interval [0, ½), namely when $0 \leq x$ and $y \leq ½$, the initially output code is 0 no matter what input symbols come in next. The output of 0 is followed by the updating of the interval from [x, y) to [2×x, 2×y).

When the selected interval [x, y) is included in [½, 1) as shown in FIG. 8, namely, when $½ \leq x$ and $y \leq 1$, the initially output code is 1 no matter what input symbol comes in next. The output of 1 is followed by the updating of the interval from [x, y) to [2×(x−½), 2×(y−½)).

When the selected interval [x, y) is included in [¼, ¾) as shown in FIG. 9, namely, when $¼ \leq x$ and $y \leq ¾$, the output code is provided in the method to be described below. Although the output code to be provided is yet to be determined, as apparent from FIG. 9, if 0 is output, it is necessarily followed by the output code of 1, and if 1 is output, it is necessarily followed by the output code of 0. The interval is thus updated from [x, y) to [2×(x−¼), 2×(y−¼)) on condition that a next output is followed by a subsequent output code opposite to the preceding output.

In the actual arithmetic coding, each time the coding interval is segmented by each input symbol, a determination is made of whether the resulting coding interval is included in one of the three intervals, and as long as the resulting code is included in one of the three intervals, the update process is repeatedly applied. This process is called a resealing.

As for the final input symbol, the coding interval subsequent to segmentation of coding interval and resealing necessarily includes one of the intervals [0, ¼), [¼, ½), [½, ¾), and [¾, 1). If neither of them is included, resealing has to be applied. In response to each case, output codes 00, 01, 10 and 11 are respectively output. This process is called flushing.

Referring to a flow diagram shown in FIG. 10, the process of flushing is now discussed. It is determined in step S1 whether the coding interval [x, y) subsequent to coding interval segmentation and resealing satisfies the condition of x=0 and $¼ \leq y$. When it is determined that the coding interval [x, y) satisfies the condition x=0 and $¼ \leq y$, the process goes to step S2 to output the code 00 and ends.

When it is determined in step S1 that the coding interval [x, y) fails to satisfy the condition x=0 and $¼ \leq y$, the process goes to step S3 to determine whether the coding interval [x, y) subsequent to coding interval segmentation and resealing satisfies the condition of $x \leq ¼$ and $½ \leq y$. When it is determined that the coding interval [x, y) satisfies the condition $x \leq ¼$ and $½ \leq y$, the process goes to step S4 to output the code 01 and ends. On the other hand, when it is determined that the coding interval [x, y) fails to satisfy the condition $x \leq ¼$ and $½ \leq y$, the process goes to step S5.

It is determined in step S5 whether the coding interval [x, y) satisfies the condition of $x \leq ½$ and $¾ \leq y$. When it is determined that the coding interval [x, y) satisfies the condition $x \leq ½$ and $¾ \leq y$, the process goes to step S6 to output the code 10 and ends. On the other hand, when it is determined that the coding interval [x, y) fails to satisfy the condition $x \leq ½$ and $¾ \leq y$, the process goes to step S7 to output the code 11 and ends.

The flushing process is performed subsequent to the coding of the final input symbol in principle. In case of a system that switches back and forth between arithmetic coding and FLC (Fixed Length Code) or VLC (Variable Length Code), the flushing process is performed after an input symbol immediately prior to a switching is coded when switching over to one of two codes from an arithmetic code.

In the arithmetic coding, a determination is made of which one of the segment intervals of the base interval an input code corresponds to and the symbol corresponding to the interval is output. To determine which segment interval the input code corresponds to, a prereading is typically performed. When all symbols are decoded, a process for recovering preread codes is required. This process is called a reset.

FIG. 11 is a flow chart showing the reset process. In step S11, the preread codes are recovered by fixed-number bits. The value of the fixed number is a bit number that is preread for the selection of one among the segment intervals.

The arithmetic coding advantageously requires only the code amount corresponding to the entropy of the input symbols. If the flushing process is involved, however, the arithmetic codes end with extra bits.

To recover errors in codes during coding, a synchronization code called FLC is inserted. Inserting an FLC requires that the arithmetic coding apparatus be flushed, lowering the efficiency of coding. To increase a resistance to error, the number of flushes has to be increased. The coding efficiency is even further lowered.

VLC is sometimes combined with the arithmetic coding. Such a usage also requires that the arithmetic coding apparatus be flushed, lowering the coding efficiency.

SUMMARY OF THE INVENTION

Accordingly, it is an object of the present invention to provide an apparatus and method for arithmetic coding which reduce the amount of codes generated in the course of arithmetic coding.

It is yet another object of the present invention to provide an apparatus and method for arithmetic decoding which decode the codes coded through arithmetic coding.

It is yet another object of the present invention to provide a storage medium that stores an arithmetic code of high coding efficiency.

The arithmetic coding apparatus of the present invention for arithmetically coding a string of input symbols according to the probability of occurrence of an input symbol, comprises a coding module for segmenting a base interval as a predetermined real number interval according to the predetermined probability of occurrence and for selecting a segmented coding interval corresponding to an input symbol to output a code corresponding to the selected coding interval, and a control module for determining at the coding of a final input symbol whether the coding interval corresponding to the input symbol includes the maximum value and the minimum value of the base interval and for switching the output code based on the determination result.

In the arithmetic coding apparatus, the control module determines whether the coding interval includes a coordinate value of ¼ in the base interval and switches the output codes based on the determination result.

In the arithmetic decoding apparatus for arithmetically decoding, according to a predetermined probability of occurrence, an arithmetic code into which a string of predetermined symbols are coded according to the probability of occurrence to output the string of predetermined symbols, the apparatus comprises a decoding module for segmenting a base interval as a predetermined real number interval according to the predetermined probability of occurrence and for selecting a segmented coding interval corresponding to an input code to output a symbol corresponding to the selected coding interval, and a control module for determining at the decoding of a final symbol whether the coding interval corresponding to the symbol includes the maximum value and the minimum value of the base interval and for switching decoding processes based on the determination result.

The arithmetic coding method for arithmetically coding a string of input symbols according to the probability of occurrence of an input symbol, comprises the coding step for segmenting a base interval as a predetermined real number interval according to the predetermined probability of occurrence and for selecting a segmented coding interval corresponding to an input symbol to output a code corresponding the selected coding interval, and the control step for determining at the coding of a final input symbol whether the coding interval corresponding to the input symbol includes the maximum value and the minimum value of the base interval and for switching the output codes based on the determination result.

In the arithmetic coding method, the control step comprises determining whether the coding interval includes a coordinate value of ¼ in the base interval and switches the output codes based on the determination result.

In the arithmetic decoding method for arithmetically decoding, according to a predetermined probability of occurrence, an arithmetic code into which a string of predetermined symbols are coded according to the probability of occurrence to output the string of predetermined symbols, the method comprises the decoding step for segmenting a base interval as a predetermined real number interval according to the predetermined probability of occurrence and for selecting a segmented coding interval corresponding to an input code to output a symbol corresponding to the selected coding interval, and the control step for determining at the decoding of a final input symbol whether the coding interval corresponding to the symbol includes the maximum value and the minimum value of the base interval and for switching decoding processes based on the determination result.

The storage medium of the present invention, decodable by a decoding apparatus, stores therewithin a code that is obtained by arithmetically coding a string of predetermined symbols according to a predetermined probability of occurrence, wherein the code is decoded following the decoding step for segmenting a base interval as a predetermined real number interval according to the predetermined probability of occurrence and for selecting a segmented coding interval corresponding to an input code to output a symbol corresponding the selected coding interval and the control step for determining at the decoding of a final symbol whether the coding interval corresponding to the symbol includes the maximum value and the minimum value of the base interval and for switching decoding processes based on the determination result.

The storage medium of the present invention, decodable by a decoding apparatus, stores therewithin a code that is obtained by arithmetically coding a string of predetermined symbols according to a probability of occurrence of an input symbol, wherein the code is coded following the coding step for segmenting a base interval as a predetermined real number interval according to a predetermined probability of occurrence and for selecting a segmented coding interval corresponding to an input symbol to output a code corresponding to the selected coding interval, and the control step for determining at the coding of a final input symbol whether the coding interval corresponding to the input symbol includes the maximum value and the minimum value of the base interval and for switching the output codes based on the determination result.

BRIEF DESCRIPTION OF THE DRAWINGS

FIG. 11 is a flow diagram of the flushing process of the related art.

DESCRIPTION OF THE PREFERRED EMBODIMENTS

Figure 1:
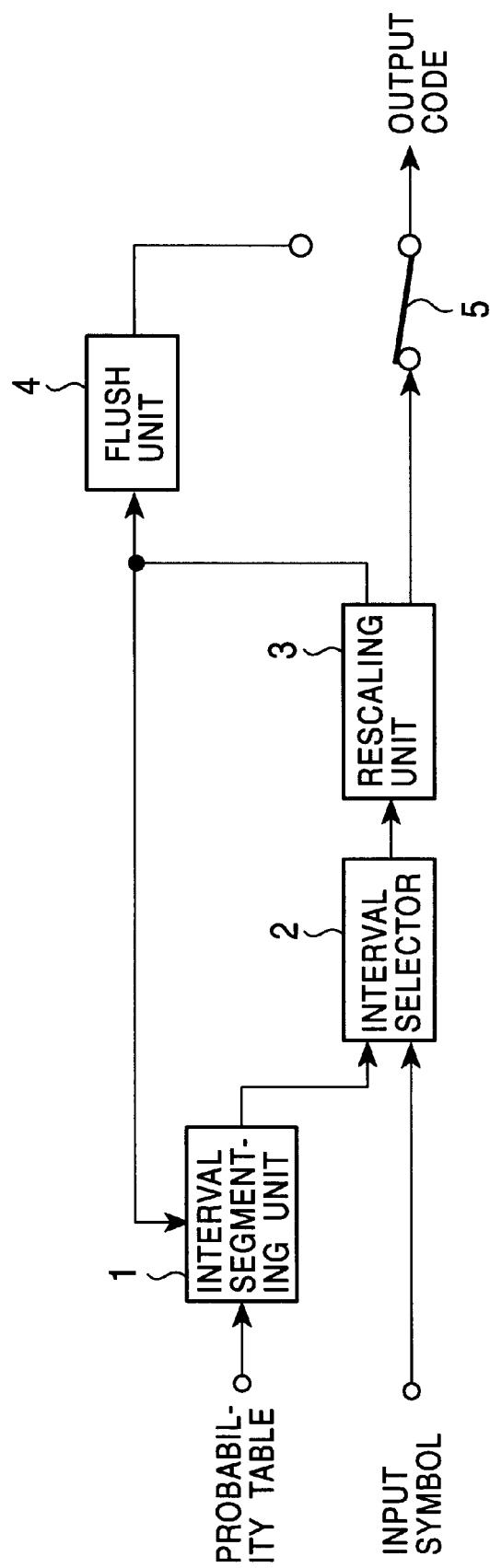
FIG. 1 is a block diagram showing one embodiment of the arithmetic coding apparatus of the present invention.

Referring now to the drawings, the embodiments of the present invention are discussed.

FIG. 1 is a block diagram showing one embodiment of the arithmetic coding apparatus of the present invention. In the arithmetic coding apparatus, input symbols are sequentially fed to an interval selector 2 while a probability table Pa is input to an interval segmenting unit 1. The probability table Pa shows the probability of occurrence for a symbol a, and Pb is 1−Pa where the probability of occurrence of a symbol b is designated Pb. The probability table Pa is beforehand determined to be a fixed value. Based on both the input probability table Pa and a coding interval [x, y) (initially a base interval [0, 1), and thereafter, [x, y) supplied by a resealing unit 3 to be described later), the interval segmenting unit 1 divides the interval [x, y) into segment intervals [x, x+Pa(y−x)) and [x+Pa(y−x), y) by a ratio of Pa:(1−Pa), and the segment intervals are input to the interval selector 2.

The interval selector 2 selects an interval corresponding to an input symbol, among the segment intervals of the coding interval. More particularly, when the input symbol is a, the interval [x, x+Pa(y−x)) is selected, and when the input symbol is b, the interval [x+Pa(y−x), y) is selected. The selected interval is input to the resealing unit 3.

Figure 7:
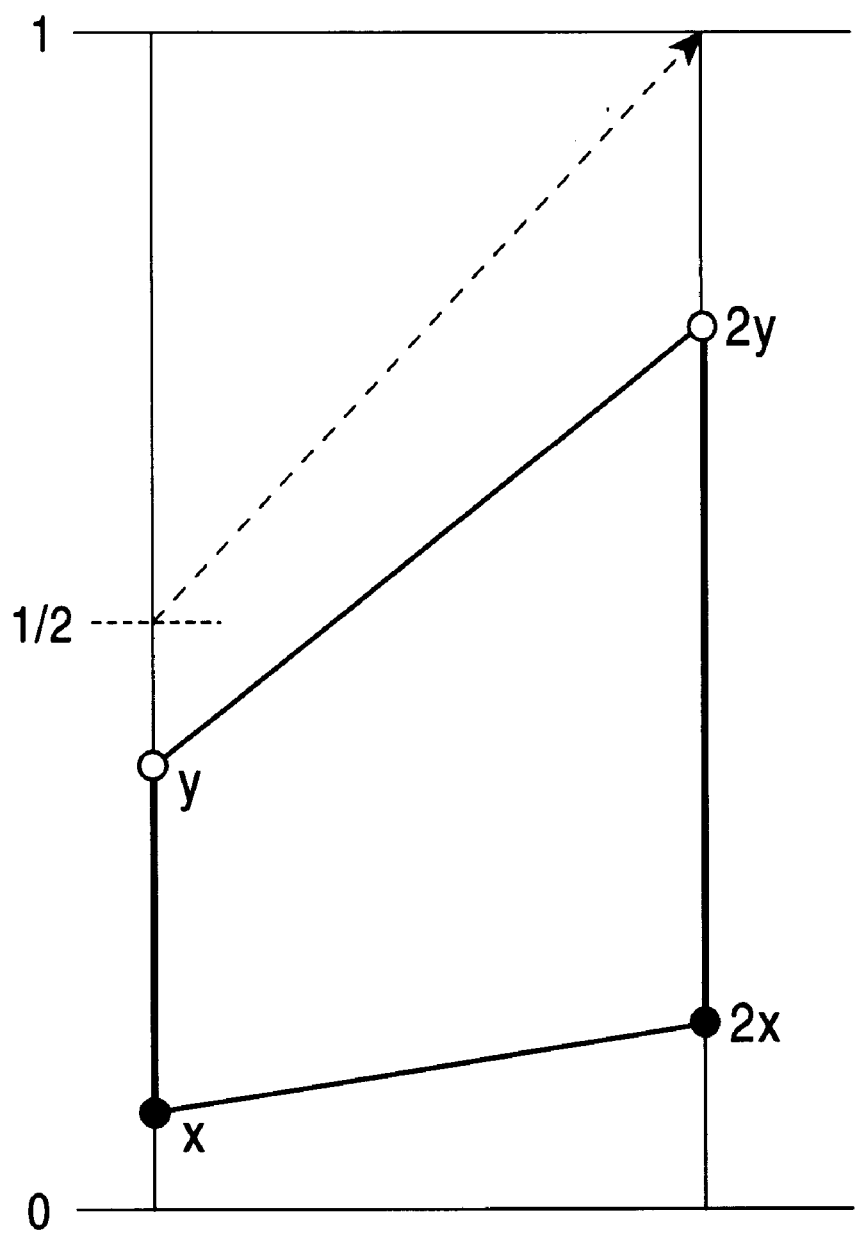
FIG. 7 shows a resealing process.
Figure 8:
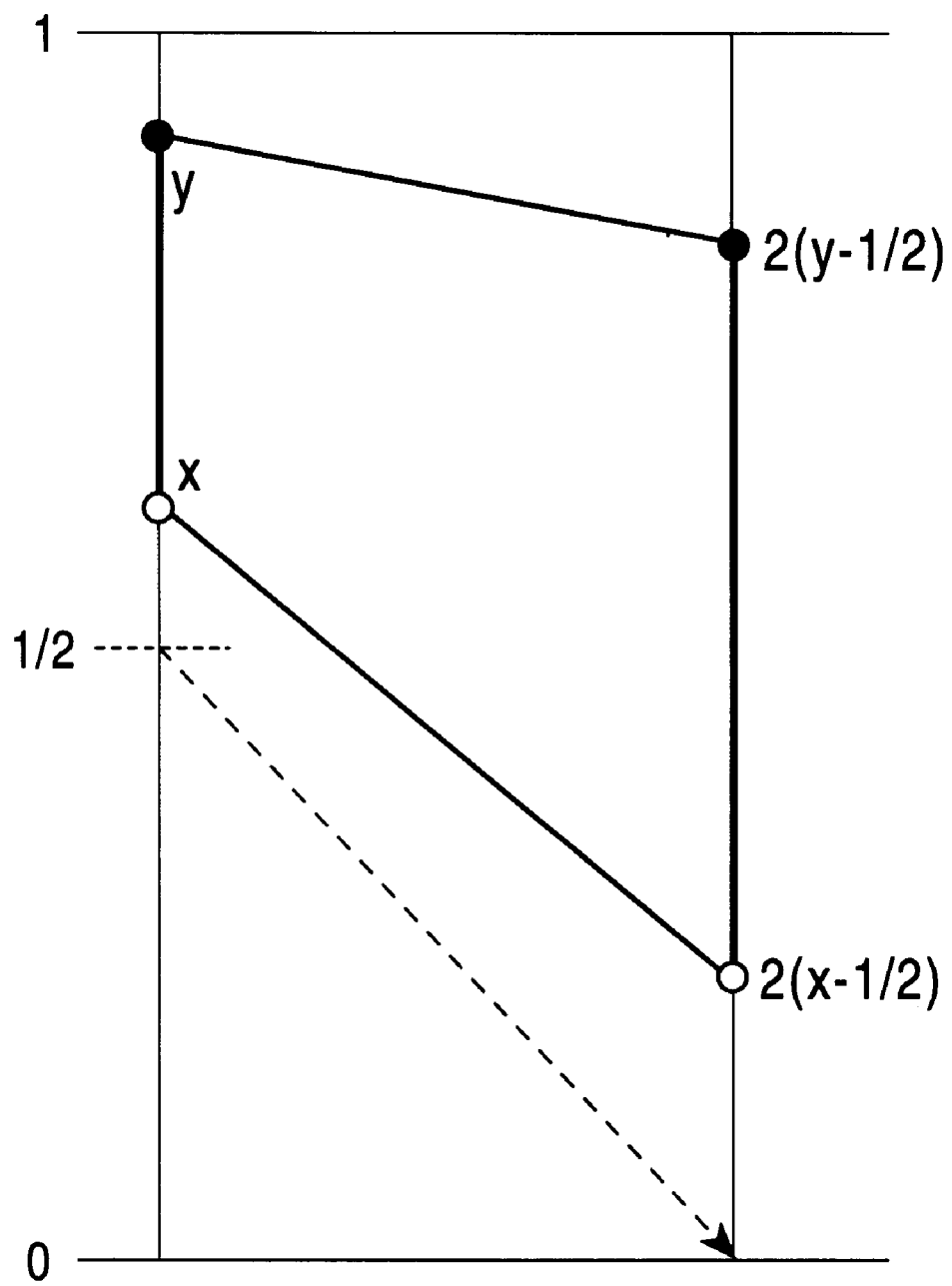
FIG. 8 shows a resealing process.
Figure 9:
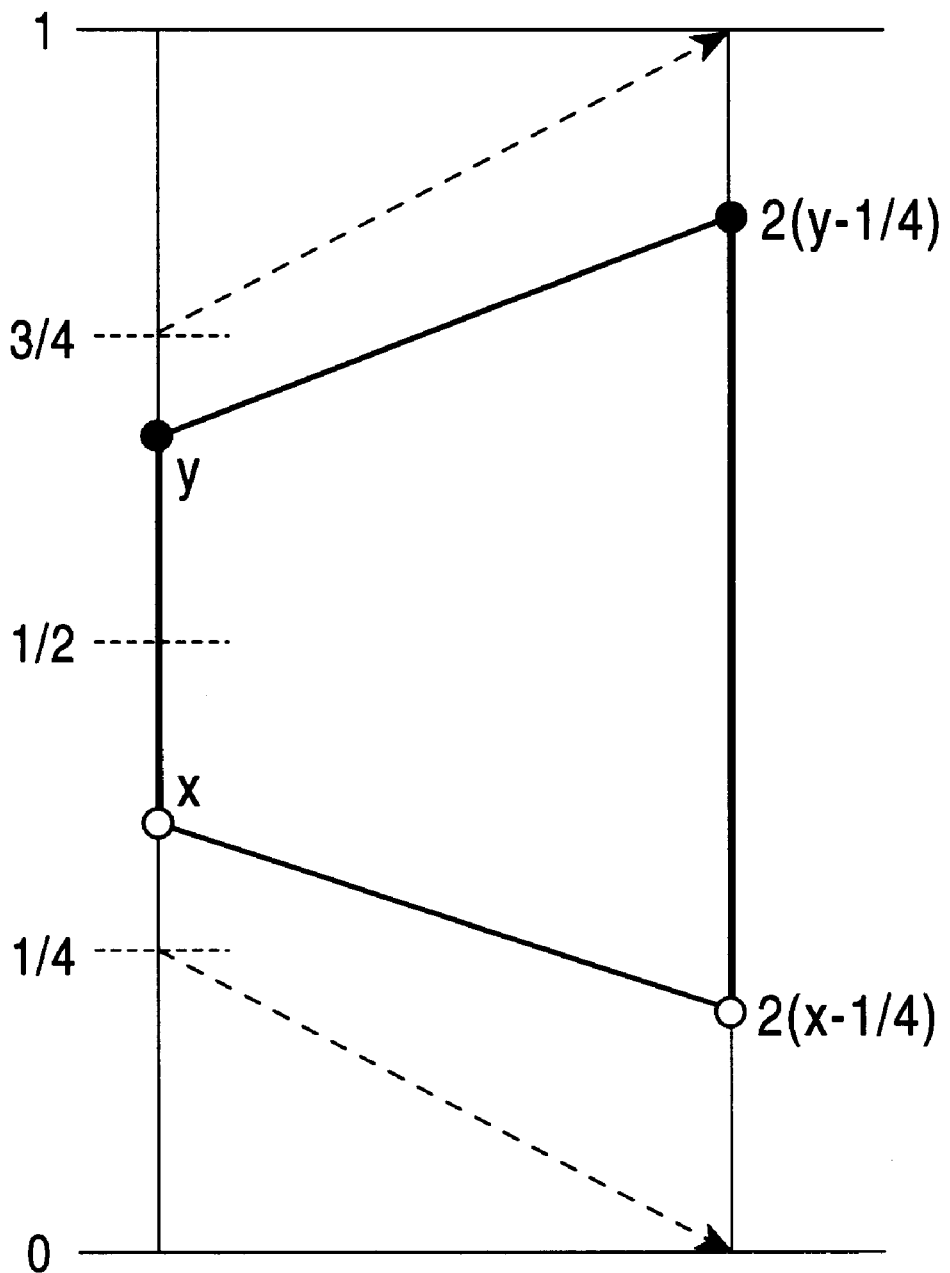
FIG. 9 shows a resealing process.
Figure 10:
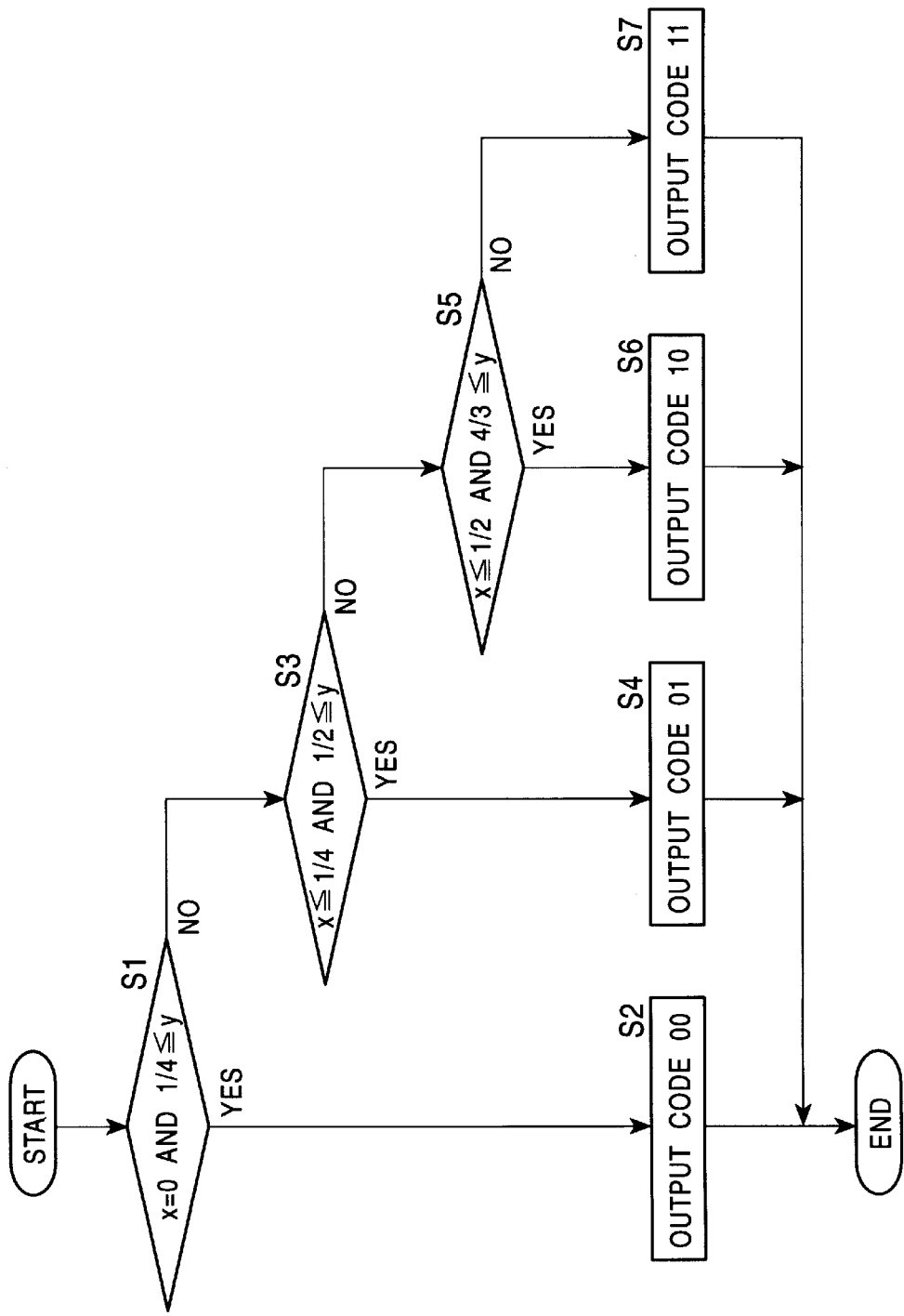
FIG. 10 is a flow diagram of the flushing process of the related art.

The resealing unit 3 performs resealing process to the input segment interval as described with reference to FIGS. 7, 8 and 9 not to lower significant figure, and a code resulting from the process is supplied to a switch 5. The resealing unit 3 feeds the rescaled segment interval as a new coding interval to both the interval segmenting unit 1 and the flush unit 4.

After the above process is repeated until a final input symbol, the flush unit 4 performs the flushing process, and the resulting codes are supplied to the switch 5. The flush process by the flush unit 4 will be detailed later. The switch 5 is connected such that it selects between the outputs of the resealing unit 3 and the flush unit 4. While the input signals are supplied, the switch 5 is connected to the resealing unit 3 to deliver the output from the resealing unit 3. When the process (interval selection and resealing) for a final input symbol is complete, a reconnection is made to connect the switch 5 to the flush unit 4 from the resealing unit 3 to deliver the output of the flush unit 4. As described above, the switch 5 selects between the codes of the resealing unit 3 and flush unit 4 to deliver it as an output code.

The output codes of the switch 5 are finally fed to an unshown receiver via a transmission line 6 or recorded in a storage medium 7 such as a disk or a memory.

Figure 2:
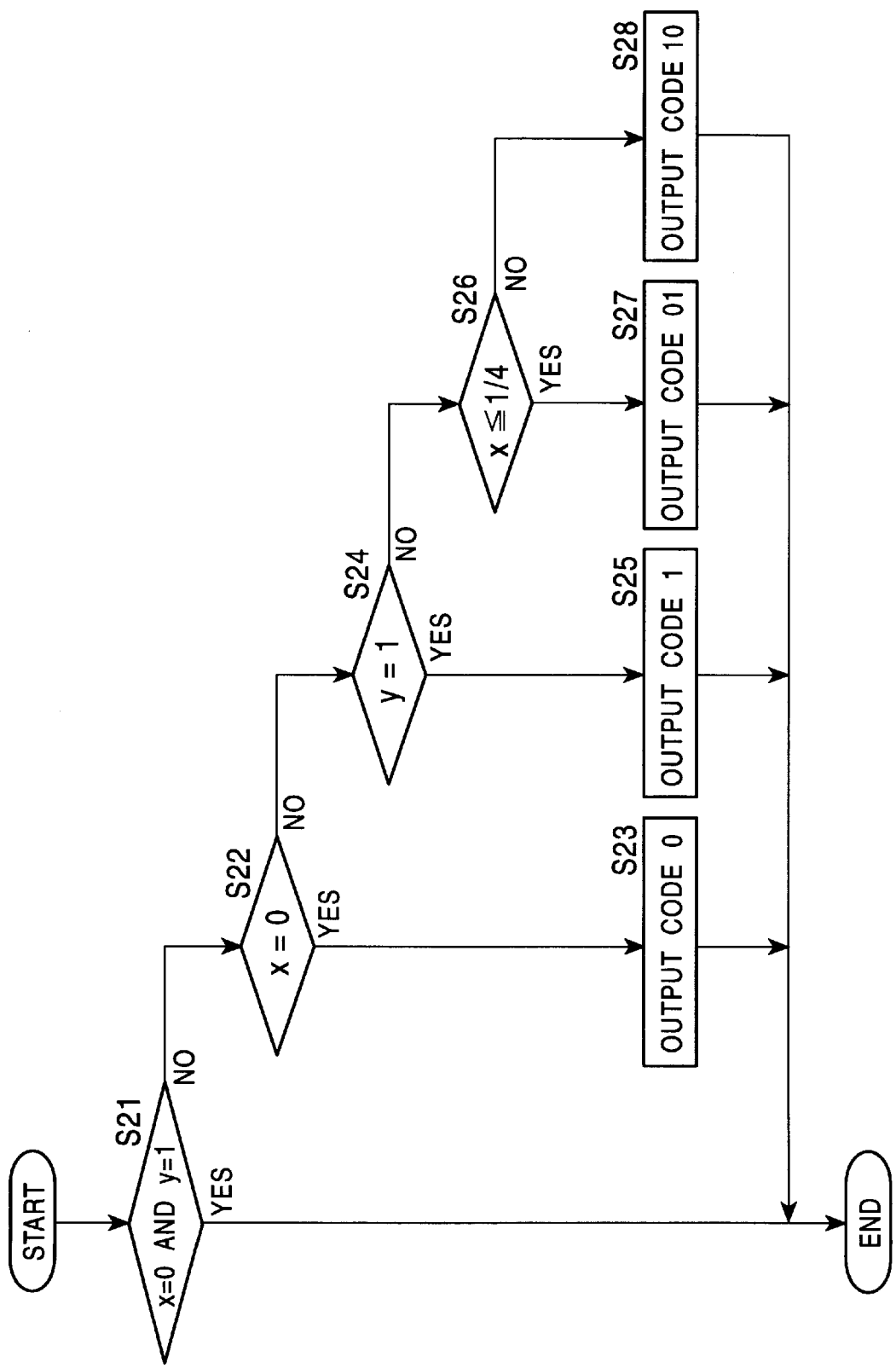
FIG. 2 is a flow diagram showing the flushing process of the flush unit 4 in FIG. 1.

Referring to a flow diagram shown in FIG. 2, the flushing process executed by the flush unit 4 is now discussed. It is determined in step S21 whether the interval [x, y) resulting from interval segmentation, interval selection and resealing of all input symbols includes the maximum and minimum values of the base interval, namely 1 and 0, respectively (x=0 and y=1). When it is determined that the interval [x, y) includes both 1 and 0, no codes are output and the process ends. When it is determined that the interval [x, y) includes at least one of 1 and 0, the process goes to step S22.

It is determined in step S22 whether the interval [x, y) includes 0 (x=0). When it is determined that the interval [x, y) includes 0, the process goes step S23 to output 0, and ends. On the other hand, when it is not determined that the interval [x, y) include 0, the process goes to step S24.

It is determined in step S24 whether the interval [x, y) includes 1 (y=1). When it is determined that the interval [x, y) includes 1, the process goes to step S24 to output 1, and ends. On the other hand, when it is not determined that the interval [x, y) includes 1, the process goes to step S26.

It is determined in step S26 whether the interval [x, y) satisfies the condition of $x \leq \frac{1}{4}$. When it is determined that $x \leq \frac{1}{4}$, the process goes to step S27 to output a code of 01 and ends. When it is not determined that $x \leq \frac{1}{4}$, the process goes step S28 to output a code of 10 and ends.

As described above, the flush unit 4 takes different processes depending on whether the interval [x, y) after interval segmentation, interval selection and resealing of all input symbols includes the maximum and minimum values of the base interval, namely 1 and 0, respectively. As described above, when both the maximum and minimum values are included, the flushing process ends without generating codes. When the maximum value only is included, 0 is generated as an output code and when the minimum value only is included, 1 is generated as an output code.

When neither the maximum value nor the minimum value is included, 01 or 10 is generated as a code depending on whether both $x \leq \frac{1}{4}$ and $\frac{1}{2} \leq y$ are satisfied. When $x \leq \frac{1}{4}$ with the resealing completed, the condition $\frac{1}{2} \leq y$ is always satisfied, and a determination of $\frac{1}{2} \leq y$ is not required.

Figure 3:
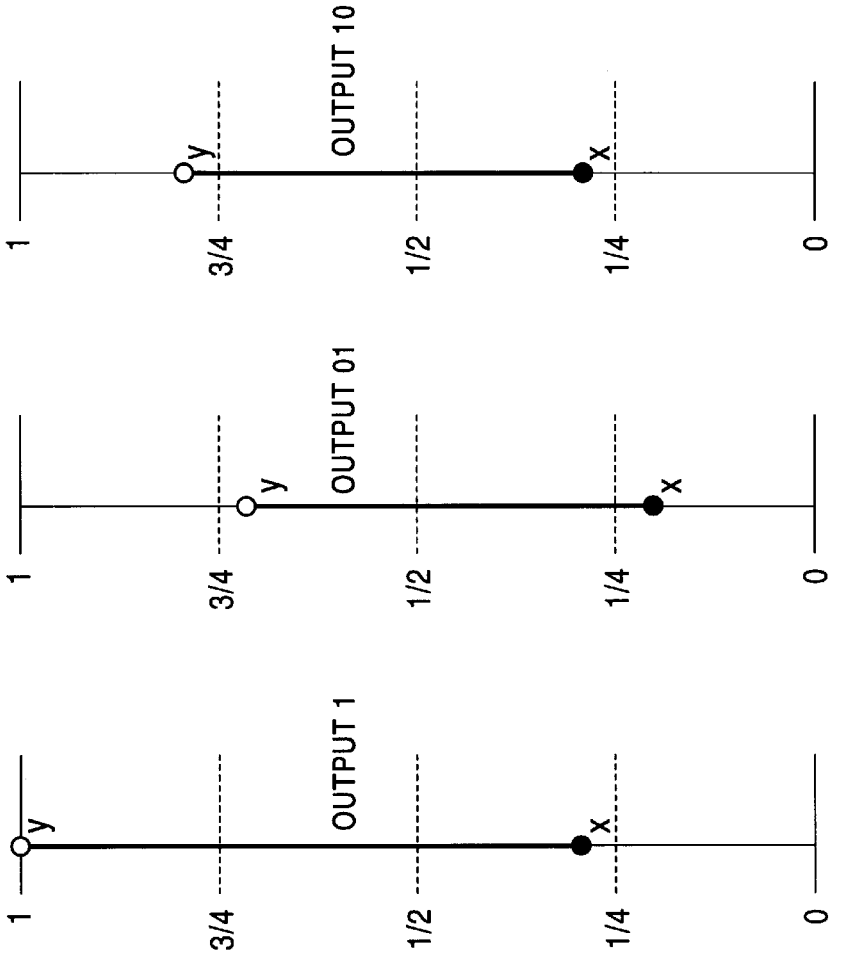
FIGS. 3A–E are charts showing the flushing process corresponding to each coding interval.

FIGS. 3A through 3E show the examples of intervals. FIG. 3A shows the example in which the base interval includes the maximum value and the minimum value. Since the interval means the entire base interval, the transmission of information for identifying it from other intervals is required, and no code output is not required. FIG. 3B shows the example in which the base interval includes the minimum value only. The output of 0 identifies it because the output code of 1 is necessarily output in case of the other interval. FIG. 3C shows the case in which the base interval includes the maximum value only. The output of 1 identifies it because the output code of 0 is necessarily output in case of the other interval. FIG. 3D shows the example in which the base interval includes neither the maximum value nor the minimum value. Since the output codes of 01 and 10 are unique to the respective selected intervals, the output code of 01 or 10 identifies one interval from the others.

In this arithmetic coding, a 2-bit output code is saved in one case (FIG. 3A), and a 1-bit output code is saved in two cases (FIGS. 3B and 3C). The remaining one case (FIGS. 3D and 3E) remains unchanged from the amount of code of the conventional art. The saving of code described here is per arithmetic coding cycle. When the switching is made between the arithmetic coding and FLC or VLC, the saving of code is repeated by the number of switchings, and as a result, a large amount of codes is reduced.

Figure 4:
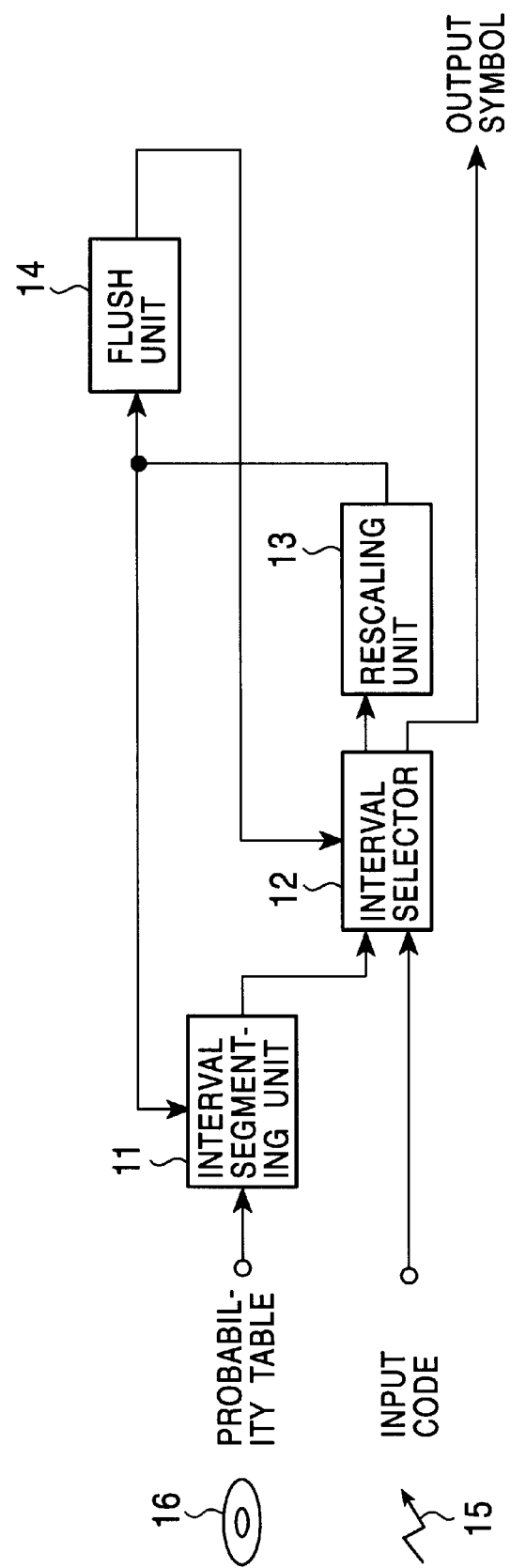
FIG. 4 is a block diagram showing one embodiment of the arithmetic decoding apparatus of the present invention.

FIG. 4 is a block diagram showing one embodiment of the arithmetic decoding apparatus corresponding to the arithmetic coding apparatus shown in FIG. 1.

The arithmetic decoding apparatus receives codes at an unshown receiver via a transmission line 15 or codes reproduced from a storage medium such as a disk or memory. A probability table Pa is input to the arithmetic decoding apparatus. The input codes are sequentially fed to an interval selector 12 while the probability table Pa is fed to an interval segmenting unit 11. Based on both the input probability table Pa and a coding interval [x, y) (initially a base interval [0, 1), and thereafter, [x, y) supplied by a rescaling unit 13 to be described later), the interval segmenting unit 11 divides the interval [x, y) into segment intervals [x, x+Pa(y−x)) and [x+Pa(y−x), y) by a ratio of Pa:(1−Pa), and the segment intervals are input to the interval selector 12.

The interval selector 12 selects an interval corresponding to an input code, among the segment intervals of the coding interval. More particularly, when the input code is interpreted as a fraction in a binary form and is included in the segment interval [x, x+Pa(y−x)), the segment interval [x, x+Pa(y−x)) is selected, and when the input code is included in the interval [x+Pa(y−x), y), the interval [x+Pa(y−x), y) is selected. The symbol corresponding to the segment interval is delivered as an output symbol. The selected segment interval is fed to a rescaling unit 13.

The rescaling unit 13 performs rescaling process to the input segment interval as described with reference to FIGS. 7, 8 and 9 not to lower significant figure, and the segment interval rescaled is fed as a new coding interval to the interval segmenting unit 11 and a reset unit 14.

Figure 5:
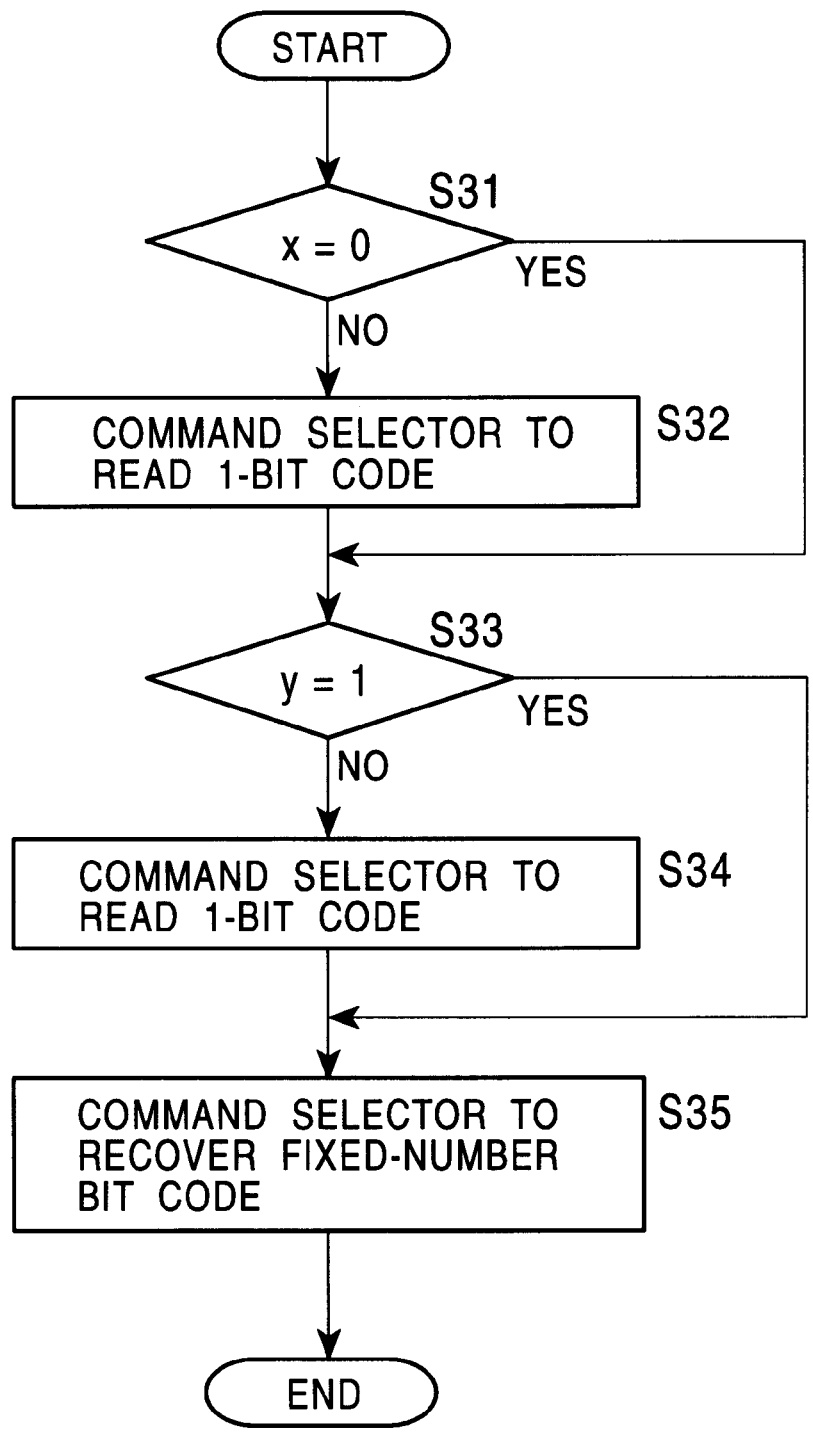
FIG. 5 is a block diagram showing the reset process by a reset unit 14 in FIG. 4.
Figure 6:
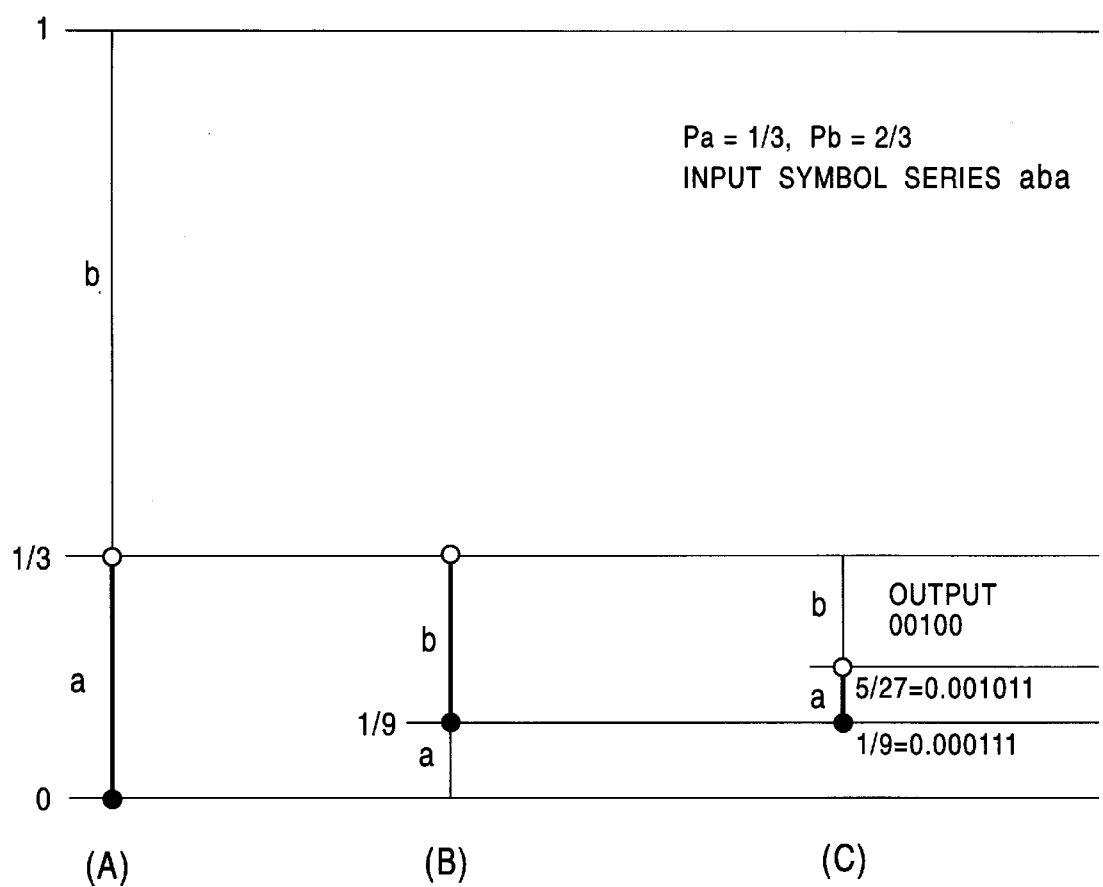
FIG. 6 shows the principle of the conventional arithmetic coding.

After the above process is repeated until a final input symbol is output in response to a final input code, the flush unit 14 performs the reset process. The reset process performed by the reset unit 14 is now discussed referring to a flow diagram shown in FIG. 5.

It is determined in step S31 whether the interval [x, y) resulting from decoding and rescaling all output symbols includes the minimum value of the base interval, namely 0 (x=0). When it is determined that the coding interval [x, y) does not include 0, the interval selector 13 is instructed to read a 1-bit code in step S32. The process goes to step S33. When it is determined that the coding interval [x, y) includes 0, no instruction is given to the interval selector 13, and the process goes to step S33.

It is determined in step S33 whether the interval [x, y) includes the maximum value of the base interval, namely 1 (y=1). When it is determined that the coding interval [x, y) does not include 1, the interval selector 13 is instructed to read a 1-bit code in step S34. The process goes to step S35. When it is not determined that the coding interval [x, y) includes 1, no instruction is given to the interval selector 13, and the process goes to step S35. In step S35, the interval selector 13 is instructed to recover fixed-number bits, and the process ends.

In response to an instruction given by the reset unit 14, the interval selector 13 processes the codes. More particularly, when the interval selector 13 is instructed to read a 1-bit code from the reset unit 14, the interval selector 13 reads the codes by 1 bit. When the interval selector 13 is instructed to recover the input codes by the fixed-number bits, the interval selector 13 recover the input codes by the fixed-number bits.

The number of bits read is 0 when both the maximum and minimum values are included, and is 1 when either the maximum value or the minimum value is included. The reading operation is simplified such that a 1-bit code is read when the minimum value is included and that a 1-code is further read when the maximum value is read. The number of bits read here corresponds to the number of bits output by the arithmetic coding apparatus in its flushing process, which is 0 bit when both the maximum and minimum values are included, 1 bit when either the maximum value or minimum value is included, and 2 bits when neither of them are included. Recovered codes of fixed-number bits follow an arithmetic code that underwent decoding, and are FLC or VLC in many cases.

As described above, the apparatus and method for arithmetic coding of the present invention result in an improved coding efficiency by reducing the output codes in the flushing process. Especially when the apparatus is used by switching back and forth between the arithmetic coding and FLC or VLC, the coding efficiency is improved.

Since in the apparatus and method for arithmetic decoding of the present invention, the process is switched depending on whether the coding interval includes the maximum and minimum values, and the codes which are obtained through the arithmetic coding apparatus shown in FIG. 1 are correctly decoded.

In the above embodiments, the input symbols are 0 and 1, and the base interval is divided into two segment intervals. The present invention is not limited to this method. Input symbols of other types may be employed. For example, arbitrary integers between 16 and −15 may be used as input symbols. In such a case, depending on the probabilities of occurrence of the input symbols, the base interval may be divided into 32 segment intervals.

The codes output by the arithmetic coding apparatus may be stored in CD-ROM (Compact Disc—Read-Only Memory) or:DVD (Digital Versatile Disc), or other storage devices.

According to the apparatus and method for arithmetic coding of the present invention, a determination is made of whether the maximum value and the minimum value of the base interval are included in the coding interval into which the base interval as a predetermined real number interval is segmented and which corresponds to a final input symbol when the final input symbol is coded, and based on the determination result, the output codes are switched. The coding efficiency is thus improved.

According to the apparatus and method for arithmetic decoding of the present invention, the maximum value and the minimum value of the base interval are included in the coding interval are included in the coding interval into which the base interval as a predetermined real number interval is segmented and which corresponds to an input symbol when the final input symbol is decoded, and based on the determination result, the decoding process is switched. The codes are thus correctly decoded.

According to the storage medium of the present invention, a determination is made of whether the maximum value and the minimum value of the base interval are included in the coding interval into which the base interval as a predetermined real number interval is segmented and which corresponds to a final input symbol when the final input symbol is coded, and based on the determination result, the output codes are thus stored. Data of high coding efficiency is thus stored.

What is claimed is:

1. An arithmetic coding apparatus for arithmetically coding a string of input symbols according to predetermined probabilities of occurrences of the input symbols, comprising:

a coding module for segmenting a base interval as predetermined real number intervals according to the predetermined probabilities of occurrences and for selecting a segmented coding interval corresponding to an input symbol to output a code corresponding to the selected coding interval; and a control module for determining at the coding of a final symbol whether the coding interval corresponding to the final input symbol includes either one of the maximum value and the minimum value of the base interval and for switching the output codes based on the determination result.

2. An arithmetic coding apparatus according to claim 1, wherein the control module determines whether the coding interval includes a coordinate value of ¼ in the base interval and switches the output codes based on the determination result.

3. An arithmetic coding apparatus according to claim 1, wherein when the coding interval for the final input symbol is determined to include either one of the maximum and minimum values of the base interval, an output code of a first bit length is output, and when the coding interval for the final input symbol is determined not to include either one of the maximum and minimum values, an output code of a second, longer bit length is output.

4. An arithmetic decoding apparatus for arithmetically decoding, according to predetermined probabilities of occurrences, an arithmetic code into which a string of predetermined symbols are coded according to the probabilities of occurrences to output the string of predetermined symbols, the apparatus comprising:

a decoding module for segmenting a base interval as predetermined real number intervals according to the predetermined probabilities of occurrences and for selecting a segmented coding interval corresponding to an input code to output a symbol corresponding to the selected coding interval; and a control module for determining at the decoding of a final symbol whether the coding interval corresponding to the final symbol includes either one of the maximum value and the minimum value of the base interval and for switching decoding processes based on the determination result.

5. An arithmetic decoding apparatus according to claim 4, wherein when the coding interval for the final input symbol is determined to include either one of the maximum and minimum values of the base interval, the input code to be decoded is of a first bit length, and when the coding interval for the final input symbol is determined not to include either one of the maximum and minimum values, the input code to be decoded is of a second, longer bit length.

6. An arithmetic coding method for arithmetically coding a string of input symbols according to predetermined probabilities of occurrences of the input symbols, comprising:

segmenting a base interval as predetermined real number intervals according to the predetermined probabilities of occurrences and for selecting a segmented coding interval corresponding to an input symbol to output a code corresponding to the selected coding interval; and determining at the coding of a final symbol whether the coding interval corresponding to the final input symbol includes either one of the maximum value and the minimum value of the base interval and for switching the output code based on the determination result.

7. An arithmetic coding method according to claim 6, wherein the control step comprising determining whether the coding interval includes a coordinate value of ¼ in the base interval and switches the output codes based on the determination result.

8. An arithmetic coding method according to claim 6, wherein when the coding interval for the final input symbol is determined to include either one of the maximum and minimum values of the base interval, an output code of a first bit length is output, and when the coding interval for the final input symbol is determined not to include either one of the maximum and minimum values, an output code of a second, longer bit length is output.

9. An arithmetic decoding method for arithmetically decoding, according to predetermined probabilities of occurrences, an arithmetic code into which a string of predetermined symbols are coded according to the probabilities of occurrences to output the string of predetermined symbols, the method comprising:

segmenting a base interval as predetermined real number intervals according to the predetermined probabilities of occurrences and selecting a segmented coding interval corresponding to an input code to output a symbol corresponding to the selected coding interval; and determining at the decoding of a final input symbol whether the coding interval corresponding to the final symbol includes either one of the maximum value and the minimum value of the base interval and for switching decoding processes based on the determination result.

10. An arithmetic decoding method according to claim 9, wherein when the coding interval for the final input symbol is determined to include either one of the maximum and minimum values of the base interval, the input code to be decoded is of a first bit length, and when the coding interval for the final input symbol is determined not to include either one of the maximum and minimum values, the input code to be decoded is of a second, longer bit length.

11. A storage medium, decodable by a decoding apparatus, for storing therewithin a code that is obtained by arithmetically coding a string of predetermined symbols according to predetermined probabilities of occurrences, wherein the code is decoded in accordance with:

segmenting a base interval as predetermined real number intervals according to the predetermined probabilities of occurrences and for selecting a segmented coding interval corresponding to an input code to output a symbol corresponding to the selected coding interval; and determining at the decoding of a final symbol whether the coding interval corresponding to the final symbol includes either one of the maximum value and the minimum value of the base interval and for switching decoding processes based on the determination result.

12. A storage medium according to claim 11, wherein when the coding interval for the final input symbol is determined to include either one of the maximum and minimum values of the base interval, the input code to be decoded is of a first bit length, and when the coding interval for the final input symbol is determined not to include either one of the maximum and minimum values, the input code to be decoded is of a second, longer bit length.

13. A storage medium, decodable by a decoding apparatus, for storing therewithin a code that is obtained by arithmetically coding a string of predetermined symbols according to predetermined probabilities of occurrences of input symbols, wherein the code is coded in accordance with:

segmenting a base interval as predetermined real number intervals according to the predetermined probabilities of occurrences and for selecting a segmented coding interval corresponding to an input symbol to output a code corresponding to the selected coding interval; and determining at the coding of a final symbol whether the coding interval corresponding to the final input symbol includes either one of the maximum value and the minimum value of the base interval and for switching the output codes based on the determination result.

14. A storage medium according to claim 13, wherein when the coding interval for the final input symbol is determined to include either one of the maximum and minimum values of the base interval, an output code of a first bit length is stored, and when the coding interval for the final input symbol is determined not to include either one of the maximum and minimum values, an output code of a second, longer bit length is stored.

* * * * *